(12) United States Patent
Hsieh et al.

(10) Patent No.: US 8,471,372 B2
(45) Date of Patent: Jun. 25, 2013

(54) THIN FLIP CHIP PACKAGE STRUCTURE

(75) Inventors: Chin-Tang Hsieh, Kaohsiung (TW);
Hou-Chang Kuo, Kaohsiung (TW);
Dueng-Shiu Tzou, Kaohsiung (TW);
Chia-Jung Tu, Zhudong Township Hsinchu County (TW); Gwo-Shyan Sheu, Kaohsiung (TW)

(73) Assignee: Chipbound Technology Corporation, Hsinchu (TW)

( * ) Notice: Subject to any disclaimer, the term of this patent is extended or adjusted under 35 U.S.C. 154(b) by 140 days.

(21) Appl. No.: 13/163,877

(22) Filed: Jun. 20, 2011

(65) Prior Publication Data
US 2012/0074545 A1 Mar. 29, 2012

(30) Foreign Application Priority Data
Sep. 24, 2010 (TW) ................................ 99218538 U

(51) Int. Cl.
*H01L 23/495* (2006.01)

(52) U.S. Cl.
USPC .................... 257/675; 257/737; 257/E23.033

(58) Field of Classification Search
USPC ..................................... 257/675, 737, E23.033
See application file for complete search history.

(56) References Cited

U.S. PATENT DOCUMENTS
2012/0080783 A1 * 4/2012 Hsieh et al. .................... 257/690

* cited by examiner

*Primary Examiner* — Long Pham
(74) *Attorney, Agent, or Firm* — Jackson IPG PLLC

(57) ABSTRACT

A thin flip chip package structure comprises a substrate, a chip and a heat dissipation paste, wherein the substrate comprises an insulating layer and a trace layer. The insulating layer comprises a first insulating portion and a second insulating portion, the first insulating portion comprises a first upward surface, a first downward surface, a first thickness and a recess formed on the first downward surface, wherein the recess comprises a bottom surface. The second insulating portion comprises a second upward surface, a second downward surface and a second thickness larger than the first thickness. The trace layer is at least formed on the second insulating portion, the chip disposed on top of the substrate is electrically connected with the trace layer and comprises a plurality of bumps, and the heat dissipation paste is disposed at the recess.

7 Claims, 5 Drawing Sheets

THIN FLIP CHIP PACKAGE STRUCTURE

FIELD OF THE INVENTION

The present invention is generally relating to a thin flip chip package structure, more particularly to a thin flip chip package structure with heat dissipation capability.

BACKGROUND OF THE INVENTION

With reference to FIG. 1, a conventional thin flip chip package structure 10 comprises a substrate 11, a chip 12, a dam 13, a sealing resin 14 and a heat dissipation paste 15. The substrate 11 comprises a top surface 11a, a bottom surface 11b, and a through hole 11c penetrating the top surface 11a and the bottom surface 11b. The chip 12 disposed on the top surface 11a of the substrate 11 is electrically connected with the substrate 11 and comprises a plurality of bumps 12a. The dam 13 is formed on the top surface 11a of the substrate 11 and located at outside of the through hole 11c. The sealing resin 14 is formed on the top surface 11a of the substrate 11, and the bumps 12a are covered by the sealing resin 14. The through hole 11c is filled with the heat dissipation paste 15. The dam 13 may be utilized to block the sealing resin 14 to prevent the sealing resin 14 from flowing into the through hole 11c of the substrate 11 to pollute the heat dissipation paste 15. However, an overhigh dam 13 makes the bumps 12a of the chip 12 difficult to connect with the substrate 11 smoothly. On the contrary, once the height of the dam 13 is insufficient, a gap (not shown in Figs.) between the dam 13 and the chip 12 is formed and enables the sealing resin 14 to flow from the gap to the through hole 11c of the substrate 11 therefore polluting the heat dissipation paste 15.

SUMMARY

The primary object of the present invention is to provide a thin flip chip package structure comprising a substrate, a chip and a heat dissipation paste. The substrate comprises an insulating layer and a trace layer, the insulating layer comprises a first insulating portion and a second insulating portion formed as one-piece with the first insulating portion, wherein the first insulating portion comprises a first upward surface, a first downward surface, a recess formed at the first downward surface and a first thickness, and the recess comprises a bottom surface. The second insulating portion comprises a second upward surface, a second downward surface and a second thickness larger than the first thickness. The second upward surface of the second insulating portion and the first upward surface of the first insulating portion are coplanar. The trace layer is at least formed on the second insulating portion, the chip disposed on top of the substrate is electrically connected with the trace layer and comprises a plurality of bumps, and the heat dissipation paste is disposed at the recess.

For the reason that the insulating layer of the substrate comprises the first insulating portion and the second insulating portion, when a sealing resin is formed on the second upward surface of the second insulating portion, the sealing resin can be limited between the chip and the substrate. Besides, owing to "the second insulating portion formed as one-piece with the first insulating portion", a dam for blocking the sealing resin is no longer needed. Therefore, mentioned design possesses functions of cost saving and shorter processing duration. In addition, the second thickness of the second insulating portion is larger than the first thickness of the first insulating portion, and the first insulating portion comprises the recess so that the heat dissipation paste can be filled in the recess to raise heat dissipation efficiency.

DETAILED DESCRIPTION OF THE INVENTION

Figure 1:
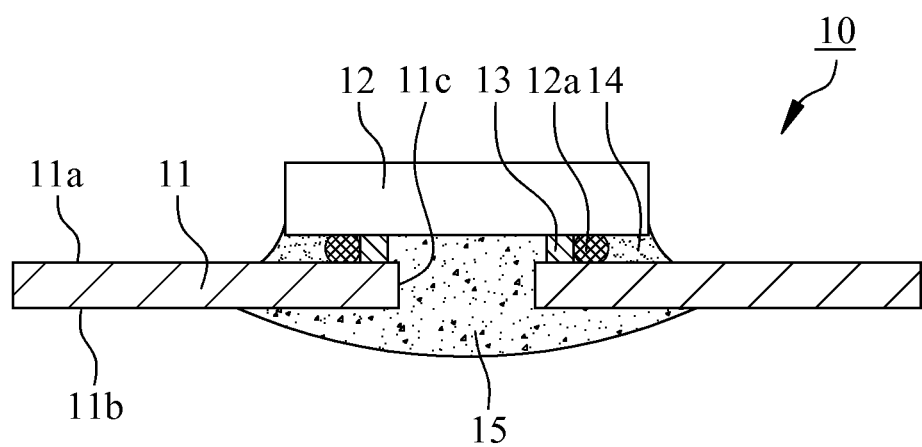
FIG. 1 is a cross-sectional schematic diagram illustrating a conventional thin flip chip package structure.
Figure 2:
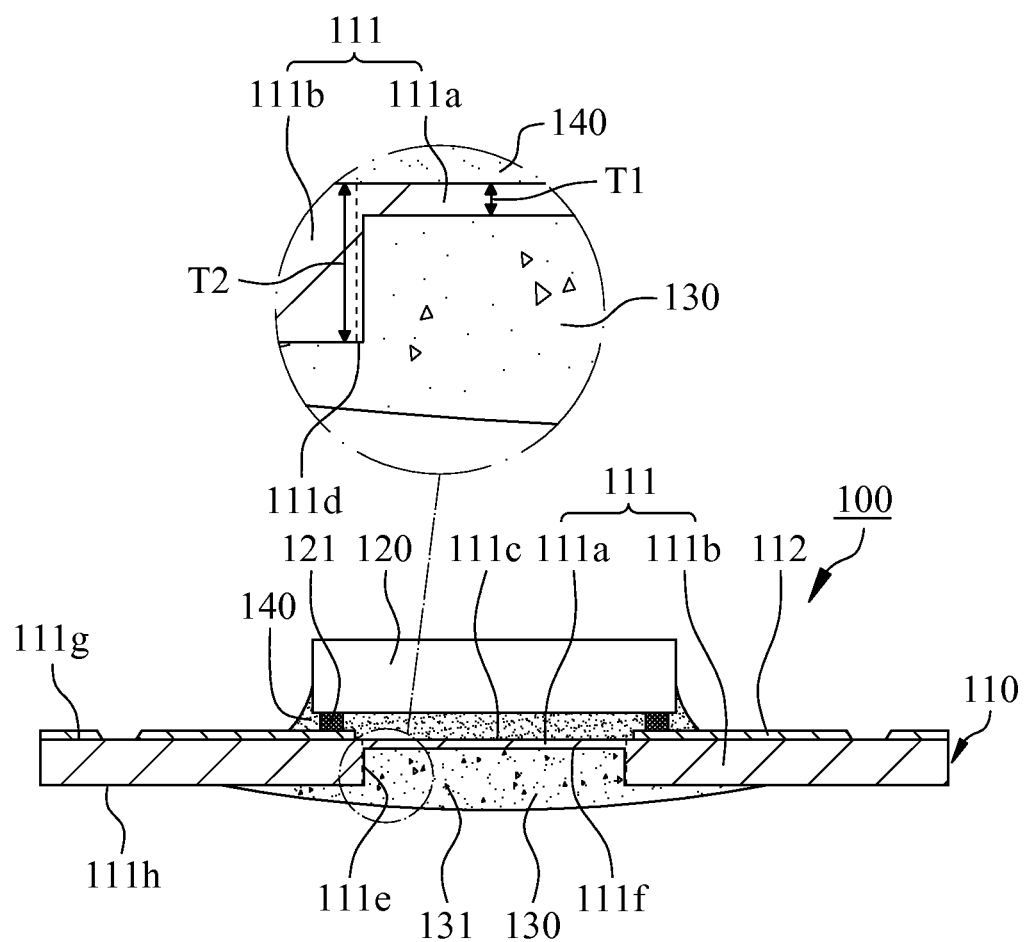
FIG. 2 is a cross-sectional schematic diagram illustrating a thin flip chip package structure in accordance with a preferred embodiment of the present invention.
Figure 3A:
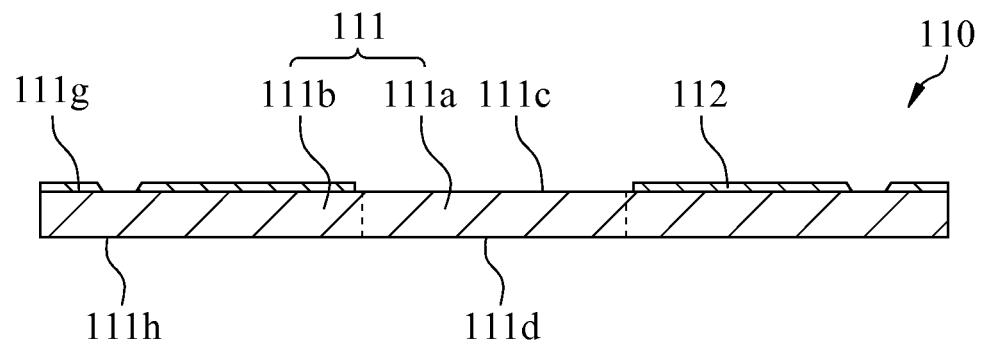
FIGS. 3A to 3D are cross-sectional views showing a manufacturing process of the thin flip chip package structure in accordance with a preferred embodiment of the present invention.
Figure 3B:
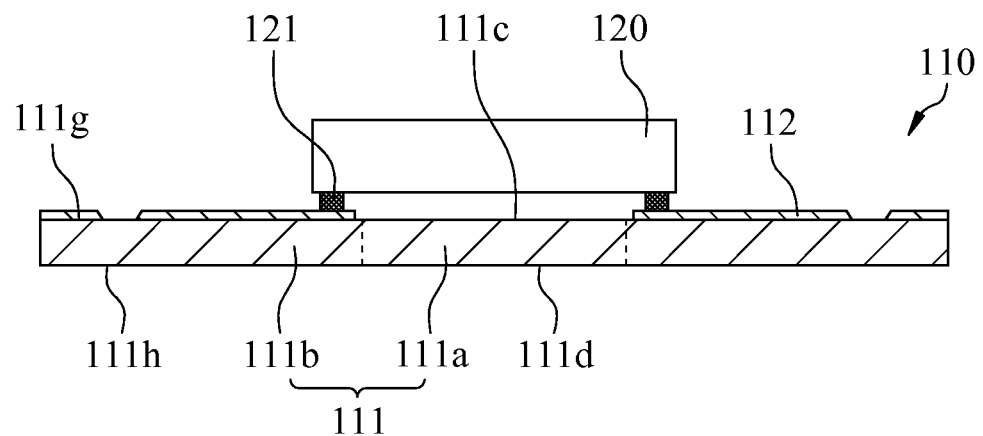
Figure 3C:
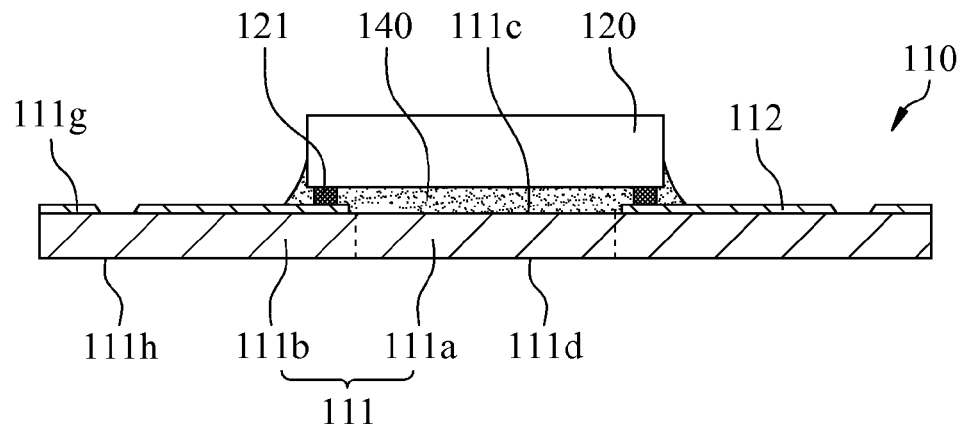
Figure 3D:
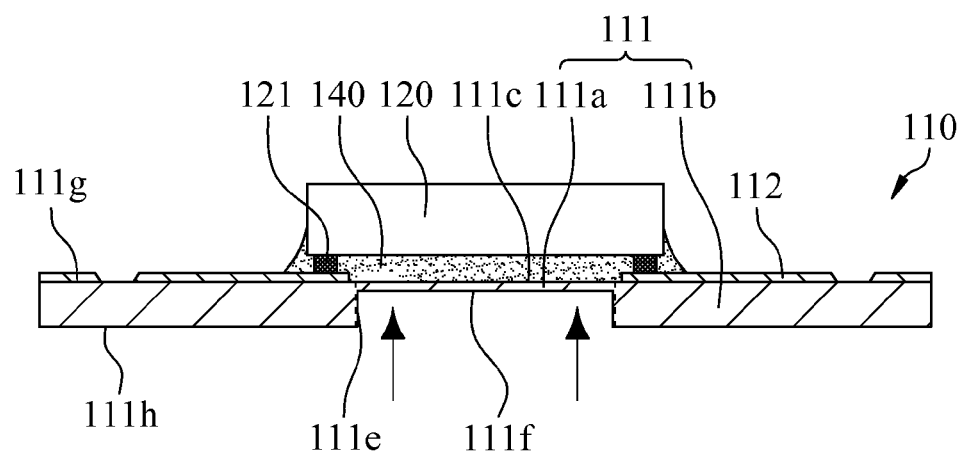

With reference to FIG. 2, a thin flip chip package structure 100 in accordance with a preferred embodiment of the present invention comprises a substrate 110, a chip 120, a heat dissipation paste 130 and a sealing resin 140. The substrate 110 comprises an insulating layer 111 and a trace layer 112, the insulating layer 111 comprises a first insulating portion 111a and a second insulating portion 111b formed as one-piece with the first insulating portion 111a, the first insulating portion 111a comprises a first upward surface 111c, a first downward surface 111d, a recess 111e formed at the first downward surface 111d and a first thickness T1, wherein the recess 111e has a bottom surface 111f. The second insulating portion 111b comprises a second upward surface 111g, a second downward surface 111h and a second thickness T2 larger than the first thickness T1. The second upward surface 111g of the second insulating portion 111b and the first upward surface 111c of the first insulating portion 111a are coplanar. The trace layer 112 is at least formed on the second insulating portion 111b. In this embodiment, the trace layer 112 is formed on the first insulating portion 111a as well. The chip 120 disposed on top of the substrate 110 is electrically connected with the trace layer 112 and comprises a plurality of bumps 121. The heat dissipation paste 130 is disposed at the recess 111e. The heat dissipation paste 130 comprises a plurality of heat conducting particles 131, in this embodiment, the heat conducting particles 131 can be chosen from tin, silver, copper, indium, lead, antimony, gold, bismuth, aluminum, alumina, aluminum nitride, boron nitride, titanium boride, titanium diboride, silicon carbide and graphite. The heat dissipation paste 130 is in contact with the bottom surface 111f of the recess 111e, preferably, the heat dissipation paste 130 is in contact with the first downward surface 111d of the first insulating portion 111a and the second downward surface 111h of the second insulating portion 111b for raising heat dissipation area. The sealing resin 140 is formed on the second upward surface 111g of the second insulating portion 111b and the first upward surface 111c of the first insulating portion 111a, and the bumps 121 of the chip 120 are covered by the sealing resin 140. For the reason that the insulating layer 111 of the substrate 110 comprises the first insulating portion 111a and the second insulating portion 111b, when the sealing resin 140 is formed on the second upward surface 111g of the second insulating portion 111b and the first upward surface 111c of the first insulating portion 111a, the sealing resin 140 can be limited between the chip 120 and the substrate 110. Besides, owing to "the second insulating portion 111b formed as one-piece with the first insulating portion 111a", a dam for blocking the sealing resin 140 to prevent the sealing resin 140 from polluting the heat dissipation paste 130 is no longer needed. Therefore, mentioned design possesses functions of cost saving and shorter processing duration. In addition, the second thickness T2 of the second insulating portion 111b is larger than the first thickness T1 of the first insulating portion 111a, and the first insulating portion 111a comprises the recess 111e so that the heat dissipation paste 130 can be filled in the recess 111e to raise heat dissipation efficiency.

Next, with reference to FIGS. 3A to 3D, mentioned figures illustrate a manufacturing flow in accordance with a preferred embodiment of the present invention. First, referring to FIG. 3A, providing a substrate 110 having an insulating layer 111 and a trace layer 112, wherein the insulating layer 111 comprises a first insulating portion 111a and a second insulating portion 111b formed as one-piece with the first insulating portion 111a, the first insulating portion 111a comprises a first upward surface 111c and a first downward surface 111d, the second insulating portion 111b comprises a second upward surface 111g and a second downward surface 111h, the second upward surface 111g of the second insulating portion 111b and the first upward surface 111c of the first insulating portion 111a are coplanar, and the trace layer 112 is formed on the second insulating portion 111b; next, referring to FIG. 3B, disposing a chip 120 on top of the substrate 110, the chip 120 is electrically connected with the trace layer 112 and comprises a plurality of bumps 121; thereafter, referring to FIG. 3C, forming a sealing resin 140 on the second upward surface 111g of the second insulating portion 111b and the first upward surface 111c of the first insulating portion 111a, and curing the sealing resin 140 with baking; then, with reference to FIG. 3D, applying a laser to remove part of the first insulating portion 111a to form a recess 111e formed at the first downward surface 111d, wherein the recess 111e has a bottom surface 111f, in this embodiment, the laser-etched first insulating portion 111a comprises a first thickness T1, the second insulating portion 111b comprises a second thickness T2, and the second thickness T2 is larger than the first thickness T1; eventually, with reference to FIG. 2, disposing a heat dissipation paste 130 at the recess 111e of the first insulating portion 111a to form a thin flip chip package structure 100.

Figure 4:
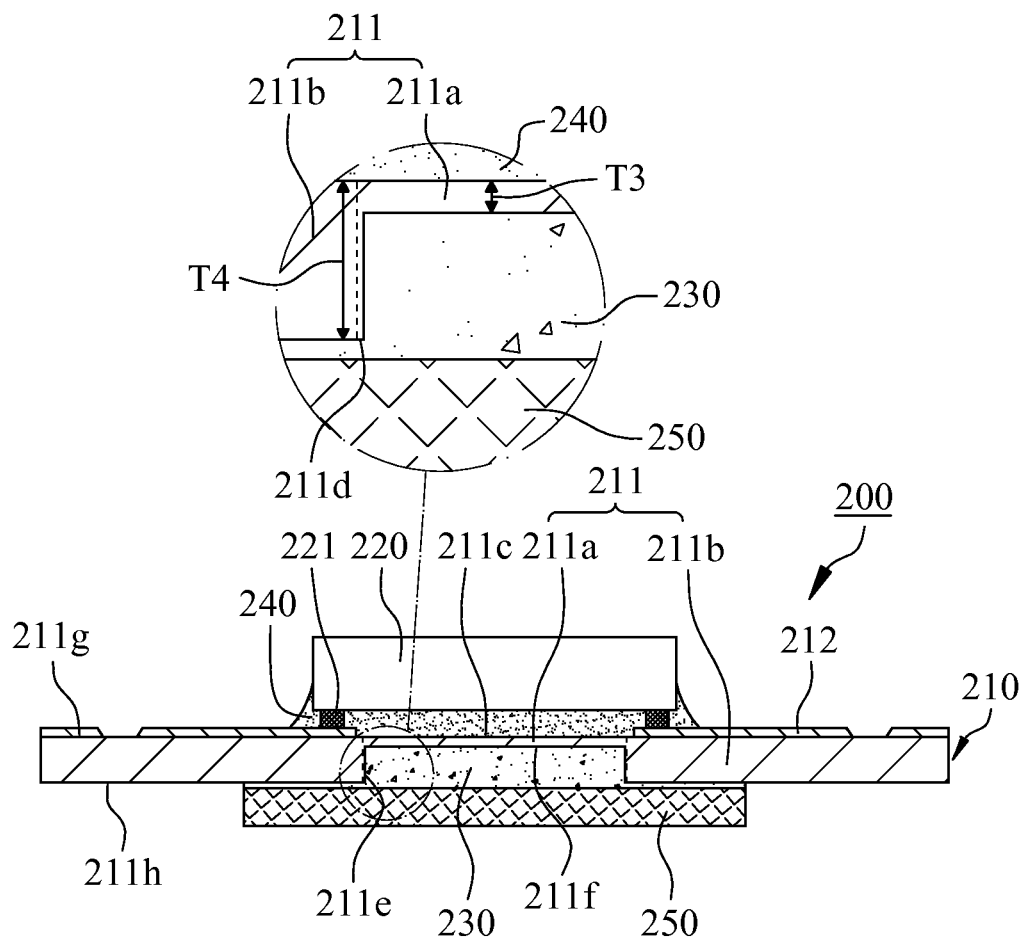
FIG. 4 is another cross-sectional schematic diagram illustrating the thin flip chip package structure in accordance with a preferred embodiment of the present invention.

With reference to FIG. 4, mentioned figure illustrate another thin flip chip package structure 200 in accordance with another preferred embodiment. The thin flip chip package structure 200 comprises a substrate 210, a chip 220, a heat dissipation paste 230, a sealing resin 240 and a heat dissipation plate 250. The substrate 210 comprises an insulating layer 211 and a trace layer 212, the insulating layer 211 comprises a first insulating portion 211a and a second insulating portion 211b formed as one-piece with the first insulating portion 211a, wherein the first insulating portion 211a comprises a first upward surface 211c, a first downward surface 211d, a recess 211e recessed into the first downward surface 111d and a first thickness T3, and the recess 211e has a bottom surface 211f. The second insulating portion 211b comprises a second upward surface 211g, a second downward surface 211h and a second thickness T4 larger than the first thickness T3. The second upward surface 211g of the second insulating portion 211b and the first upward surface 211c of the first insulating portion 211a are coplanar. The trace layer 212 is formed on the second insulating portion 211b, the chip 220 disposed on top of the substrate 210 is electrically connected with the trace layer 212 and comprises a plurality of bumps 221. The heat dissipation paste 230 is disposed at the recess 211e, and the heat dissipation paste 230 is in contact with the bottom surface 211f of the recess 211e, the first downward surface 211d of the first insulating portion 211a and the second downward surface 211h of the second insulating portion 211b. The sealing resin 240 is formed at the second upward surface 211g of the second insulating portion 211b and the first upward surface 211c of the first insulating portion 211a and covers the bumps 221 of the chip 220. The heat dissipation plate 250 is disposed at bottom of the substrate 210 and in contact with the heat dissipation paste 230 to raise heat dissipation efficiency.

While this invention has been particularly illustrated and described in detail with respect to the preferred embodiments thereof, it will be clearly understood by those skilled in the art that it is not limited to the specific features and descriptions and various modifications and changes in form and details may be made without departing from the spirit and scope of this invention.

What is claimed is:

1. A thin flip chip package structure comprises:
    a substrate having an insulating layer and a trace layer, the insulating layer comprising a first insulating portion and a second insulating portion formed as one-piece with the first insulating portion, the first insulating portion comprising a first upward surface, a first downward surface, a first thickness and a recess formed at the first downward surface,
    wherein the recess having a bottom surface, the second insulating portion comprising a second upward surface, a second downward surface and a second thickness larger than the first thickness,
    wherein the second upward surface and the first upward surface are coplanar, and the trace layer is formed on the second insulating portion;
    a chip disposed on top of the substrate, the chip comprising a plurality of bumps and electrically connecting with the trace layer; and
    a heat dissipation paste disposed at the recess.

2. The thin flip chip package structure in accordance with claim 1, wherein the heat dissipation paste is in contact with the bottom surface of the recess.

3. The thin flip chip package structure in accordance with claim 2, wherein the heat dissipation paste is in contact with the first downward surface of the first insulating portion.

4. The thin flip chip package structure in accordance with claim 1 further comprises a sealing resin formed on the second upward surface of the second insulating portion, and the bumps of the chip are covered by the sealing resin.

5. The thin flip chip package structure in accordance with claim 1, wherein the heat dissipation paste comprises a plurality of heat conducting particles, the heat conducting particles can be chosen from tin, silver, copper, indium, lead, antimony, gold, bismuth, aluminum, alumina, aluminum nitride, boron nitride, titanium boride, titanium diboride, silicon carbide and graphite.

6. The thin flip chip package structure in accordance with claim 1 further comprises a heat dissipation plate in contact with the heat dissipation paste.

7. The thin flip chip package structure in accordance with claim 1, wherein the trace layer is formed on the first insulation portion.

* * * * *